United States Patent
Yu et al.

(10) Patent No.: US 8,664,760 B2
(45) Date of Patent: Mar. 4, 2014

(54) CONNECTOR DESIGN FOR PACKAGING INTEGRATED CIRCUITS

(75) Inventors: Chen-Hua Yu, Hsin-Chu (TW); Shin-Puu Jeng, Hsin-Chu (TW); Shang-Yun Hou, Jubei (TW); Cheng-Chieh Hsieh, Yongkang District (TW); Kuo-Ching Hsu, Chung-Ho (TW); Ying-Ching Shih, Taipei (TW); Po-Hao Tsai, Zhongli (TW); Chin-Fu Kao, Taipei (TW); Cheng-Lin Huang, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/343,582

(22) Filed: Jan. 4, 2012

(65) Prior Publication Data
US 2012/0306073 A1 Dec. 6, 2012

Related U.S. Application Data

(60) Provisional application No. 61/491,301, filed on May 30, 2011.

(51) Int. Cl.
*H01L 23/48* (2006.01)
*H01L 23/52* (2006.01)
*H01L 29/40* (2006.01)

(52) U.S. Cl.
USPC .............. 257/737; 257/738; 257/E23.021; 257/E23.033; 257/E23.068; 257/E23.069

(58) Field of Classification Search
USPC .............. 257/737, 738, E23.021, E23.033, 257/E23.068, E23.069
See application file for complete search history.

(56) References Cited

U.S. PATENT DOCUMENTS

| | | | | |
|---|---|---|---|---|
| 3,996,034 A | * | 12/1976 | Taylor et al. | .................... 65/60.4 |
| 4,811,082 A | | 3/1989 | Jacobs et al. | |
| 4,990,462 A | | 2/1991 | Sliwa, Jr. | |
| 5,075,253 A | | 12/1991 | Sliwa, Jr. | |
| 5,194,403 A | * | 3/1993 | Delage et al. | ................. 438/604 |
| 5,313,371 A | * | 5/1994 | Knecht et al. | ................. 361/818 |
| 5,380,681 A | | 1/1995 | Hsu | |

(Continued)

FOREIGN PATENT DOCUMENTS

| | | |
|---|---|---|
| JP | 05-335313 | 12/1993 |
| JP | 2000-228420 | 8/2000 |

OTHER PUBLICATIONS

Lin, T.H., et al., "Electromigration Study of Micro Bumps at Si/Si Interface in 3DIC Package for 28nm Technology and Beyond," IEEE Electronic Components and Technology Conference, May 31-Jun. 3, 2011, pp. 346-350.

(Continued)

*Primary Examiner* — Ida M Soward
(74) *Attorney, Agent, or Firm* — Slater & Matsil, L.L.P.

(57) ABSTRACT

A device includes a top dielectric layer having a top surface. A metal pillar has a portion over the top surface of the top dielectric layer. A non-wetting layer is formed on a sidewall of the metal pillar, wherein the non-wetting layer is not wettable to the molten solder. A solder region is disposed over and electrically coupled to the metal pillar.

11 Claims, 16 Drawing Sheets

(56) References Cited

U.S. PATENT DOCUMENTS

| | | | | |
|---|---|---|---|---|
| 5,481,133 | A | 1/1996 | Hsu | |
| 6,002,177 | A | 12/1999 | Gaynes et al. | |
| 6,051,190 | A * | 4/2000 | Birch et al. | 422/502 |
| 6,187,678 | B1 | 2/2001 | Gaynes et al. | |
| 6,218,281 | B1 | 4/2001 | Watanabe et al. | |
| 6,229,216 | B1 | 5/2001 | Ma et al. | |
| 6,229,220 | B1 | 5/2001 | Saitoh et al. | |
| 6,236,115 | B1 | 5/2001 | Gaynes et al. | |
| 6,271,059 | B1 | 8/2001 | Bertin et al. | |
| 6,279,815 | B1 | 8/2001 | Correia et al. | |
| 6,355,501 | B1 | 3/2002 | Fung et al. | |
| 6,392,163 | B1 * | 5/2002 | Rinne et al. | 174/261 |
| 6,434,016 | B2 | 8/2002 | Zeng et al. | |
| 6,448,661 | B1 | 9/2002 | Kim et al. | |
| 6,461,895 | B1 | 10/2002 | Liang et al. | |
| 6,562,653 | B1 | 5/2003 | Ma et al. | |
| 6,570,248 | B1 | 5/2003 | Ahn et al. | |
| 6,578,754 | B1 | 6/2003 | Tung | |
| 6,592,019 | B2 | 7/2003 | Tung | |
| 6,600,222 | B1 | 7/2003 | Levardo | |
| 6,607,938 | B2 | 8/2003 | Kwon et al. | |
| 6,661,085 | B2 | 12/2003 | Kellar et al. | |
| 6,762,076 | B2 | 7/2004 | Kim et al. | |
| 6,790,748 | B2 | 9/2004 | Kim et al. | |
| 6,818,545 | B2 | 11/2004 | Lee et al. | |
| 6,853,076 | B2 | 2/2005 | Datta et al. | |
| 6,887,769 | B2 | 5/2005 | Kellar et al. | |
| 6,908,565 | B2 | 6/2005 | Kim et al. | |
| 6,908,785 | B2 | 6/2005 | Kim | |
| 6,917,119 | B2 | 7/2005 | Lee et al. | |
| 6,924,551 | B2 | 8/2005 | Rumer et al. | |
| 6,943,067 | B2 | 9/2005 | Greenlaw | |
| 6,946,384 | B2 | 9/2005 | Kloster et al. | |
| 6,975,016 | B2 | 12/2005 | Kellar et al. | |
| 7,008,867 | B2 * | 3/2006 | Lei | 438/613 |
| 7,037,804 | B2 | 5/2006 | Kellar et al. | |
| 7,056,807 | B2 | 6/2006 | Kellar et al. | |
| 7,064,436 | B2 | 6/2006 | Ishiguri et al. | |
| 7,087,538 | B2 | 8/2006 | Staines et al. | |
| 7,101,781 | B2 * | 9/2006 | Ho et al. | 438/612 |
| 7,151,009 | B2 | 12/2006 | Kim et al. | |
| 7,157,787 | B2 | 1/2007 | Kim et al. | |
| 7,215,033 | B2 | 5/2007 | Lee et al. | |
| 7,276,799 | B2 | 10/2007 | Lee et al. | |
| 7,279,795 | B2 | 10/2007 | Periaman et al. | |
| 7,307,005 | B2 | 12/2007 | Kobrinsky et al. | |
| 7,317,256 | B2 | 1/2008 | Williams et al. | |
| 7,320,928 | B2 | 1/2008 | Kloster et al. | |
| 7,345,350 | B2 | 3/2008 | Sinha | |
| 7,391,112 | B2 | 6/2008 | Li et al. | |
| 7,402,442 | B2 | 7/2008 | Condorelli et al. | |
| 7,402,515 | B2 | 7/2008 | Arana et al. | |
| 7,410,884 | B2 | 8/2008 | Ramanathan et al. | |
| 7,432,592 | B2 | 10/2008 | Shi et al. | |
| 7,494,845 | B2 | 2/2009 | Hwang et al. | |
| 7,498,119 | B2 * | 3/2009 | Limb et al. | 430/311 |
| 7,528,494 | B2 | 5/2009 | Furukawa et al. | |
| 7,531,890 | B2 | 5/2009 | Kim | |
| 7,557,597 | B2 | 7/2009 | Anderson et al. | |
| 7,576,435 | B2 | 8/2009 | Chao | |
| 7,816,743 | B2 * | 10/2010 | Furukawa et al. | 257/401 |
| 7,834,450 | B2 | 11/2010 | Kang | |
| 7,863,739 | B2 * | 1/2011 | Lee et al. | 257/737 |
| 8,159,070 | B2 * | 4/2012 | Lin et al. | 257/758 |
| 8,232,193 | B2 * | 7/2012 | Chang | 438/613 |
| 8,242,011 | B2 * | 8/2012 | Lim et al. | 438/613 |
| 2002/0166688 | A1 * | 11/2002 | Smith | 174/52.2 |
| 2003/0006062 | A1 * | 1/2003 | Stone et al. | 174/255 |
| 2004/0007779 | A1 * | 1/2004 | Arbuthnot et al. | 257/780 |
| 2004/0096697 | A1 * | 5/2004 | Tai et al. | 428/690 |
| 2010/0109159 | A1 * | 5/2010 | Ho et al. | 257/737 |
| 2010/0164098 | A1 * | 7/2010 | Kuechenmeister et al. | 257/737 |
| 2011/0006416 | A1 * | 1/2011 | Tseng et al. | 257/737 |
| 2011/0193218 | A1 * | 8/2011 | Arvin et al. | 257/737 |
| 2011/0266667 | A1 * | 11/2011 | Wu et al. | 257/737 |
| 2011/0298123 | A1 * | 12/2011 | Hwang et al. | 257/737 |
| 2012/0007228 | A1 * | 1/2012 | Lu et al. | 257/692 |
| 2012/0091577 | A1 * | 4/2012 | Hwang et al. | 257/737 |

OTHER PUBLICATIONS

Wei, C.C., et al., "Comparison of the Electromigration Behaviors Between Micro-bumps and C4 Solder Bumps," 2011 Electronic Components and Technology Conference, pp. 706-710.

* cited by examiner

CONNECTOR DESIGN FOR PACKAGING INTEGRATED CIRCUITS

This application claims the benefit of the following provisionally filed U.S. patent application: Application Ser. No. 61/491,301, filed May 30, 2011, and entitled "3DIC Packaging Structures and Methods," which application is hereby incorporated herein by reference.

BACKGROUND

In the formation of a semiconductor wafer, integrated circuit devices such as transistors are first formed at the surface of a semiconductor substrate. Interconnect structures are then formed over the semiconductor substrate and the integrated devices. Connectors are formed on the surface of the semiconductor wafer, so that the integrated circuit devices can be accessed. The semiconductor wafer is sawed into a plurality of semiconductor chips.

The packaging of the semiconductor chips may be performed through reflow processes, wherein solder regions between the connectors of the semiconductor chips are reflowed to bond the semiconductor chips to other package components such as device dies, interposer, package substrates, or the like. In the reflow processes, the solder regions are molten, and the shapes and the profiles of the molten solder region are difficult to control. This may cause problems such as bridging, and hence the deterioration of the bonding quality or the yield loss.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method for forming connectors for package components is provided in accordance with various embodiments. The intermediate stages of manufacturing the connectors in accordance with the embodiments are illustrated. The variations of the embodiments are discussed. Throughout the various views and illustrative embodiments, like reference numbers are used to designate like elements.

Figure 1:
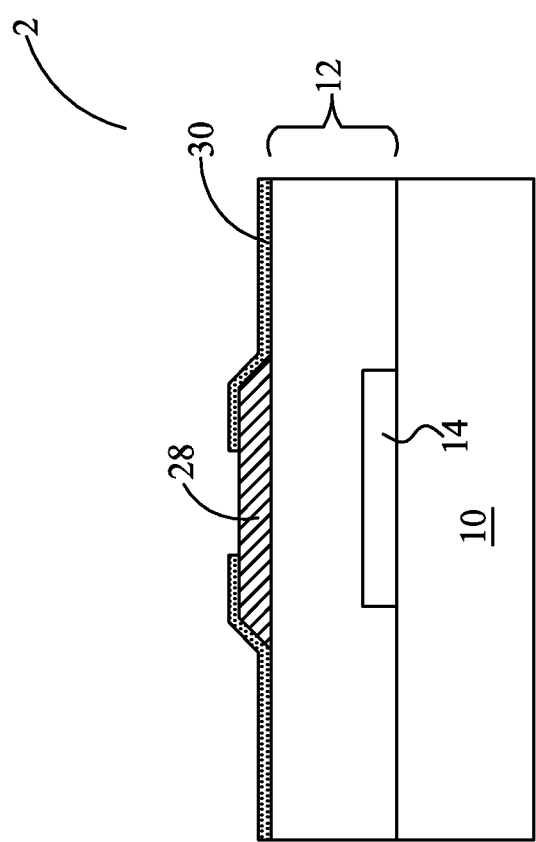
FIGS. 1 through 6C are cross-sectional views of intermediate stages in the manufacturing of a package component in accordance with embodiments.

Referring to FIG. 1, wafer 2, which includes substrate 10, is provided. In an embodiment, substrate 10 is a semiconductor substrate such as a silicon substrate, although it may be formed of other semiconductor materials, such as silicon germanium, silicon carbon, gallium arsenide, or the like. Semiconductor devices 14, which may include transistors, diodes, resistors, or the like, may be formed at the surface of substrate 10. Interconnect structure 12, which includes metal lines and vias (not shown) formed therein and electrically coupled to semiconductor devices 14, is formed over substrate 10. The metal lines and vias may be formed of copper or copper alloys, and may be formed using damascene processes. Interconnect structure 12 may include an inter-layer dielectric (ILD) and inter-metal dielectrics (IMDs).

In alternative embodiments, wafer 2 is an interposer wafer or a wafer of package substrates, and is substantially free from active devices including transistors and passive devices such as resistors, capacitors, inductors, and/or the like. In these embodiments, substrate 10 may be formed of a semiconductor material or a dielectric material, and connectors may be formed on opposite sides of substrate 10, and electrically coupled to each other.

Metal pad 28 is formed over interconnect structure 12. Metal pad 28 may comprise aluminum (Al), copper (Cu), silver (Ag), gold (Au), nickel (Ni), tungsten (W), alloys thereof, and/or multi-layers thereof. In an exemplary embodiment, metal pad 28 is formed of aluminum copper. Metal pad 28 may be electrically coupled to semiconductor devices 14, for example, through the underlying interconnect structure 12. Passivation layer 30 may be formed to cover edge portions of metal pad 28. In an exemplary embodiment, passivation layer 30 is formed of polyimide or other dielectric materials such as silicon oxide, silicon nitride, and multi-layers thereof.

Figure 2:
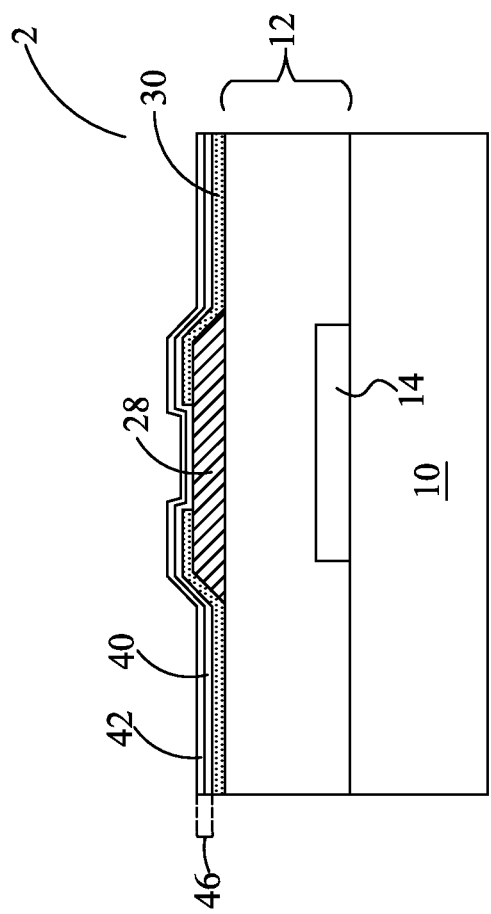

Referring to FIG. 2, under-bump metallurgy (UBM) layer 46 is formed. In an embodiment, UBM layer 46 includes barrier layer 40 and seed layer 42 over barrier layer 40. Barrier layer 40 extends into the opening in passivation layer 30 and is electrically coupled to, and may be in physical contact with, metal pad 28. Barrier layer 40 may be a titanium layer, a titanium nitride layer, a tantalum layer, or a tantalum nitride layer, or layers formed of a titanium alloy or a tantalum alloy. The materials of seed layer 42 may include copper or copper alloys, and hence seed layer 42 is alternatively referred to as a copper seed layer hereinafter. However, other metals such as silver, gold, aluminum, palladium, nickel, nickel alloys, tungsten alloys, chromium, chromium alloys, and combinations thereof may also be included. In an embodiment, barrier layer 40 and seed layer 42 are formed using physical vapor deposition (PVD) or other applicable methods. Barrier layer 40 may have a thickness between about 500 Å and about 2,000 Å. Seed layer 42 may have a thickness between about 1,000 Å and about 10,000 Å, although different thicknesses may be used.

Figure 3:
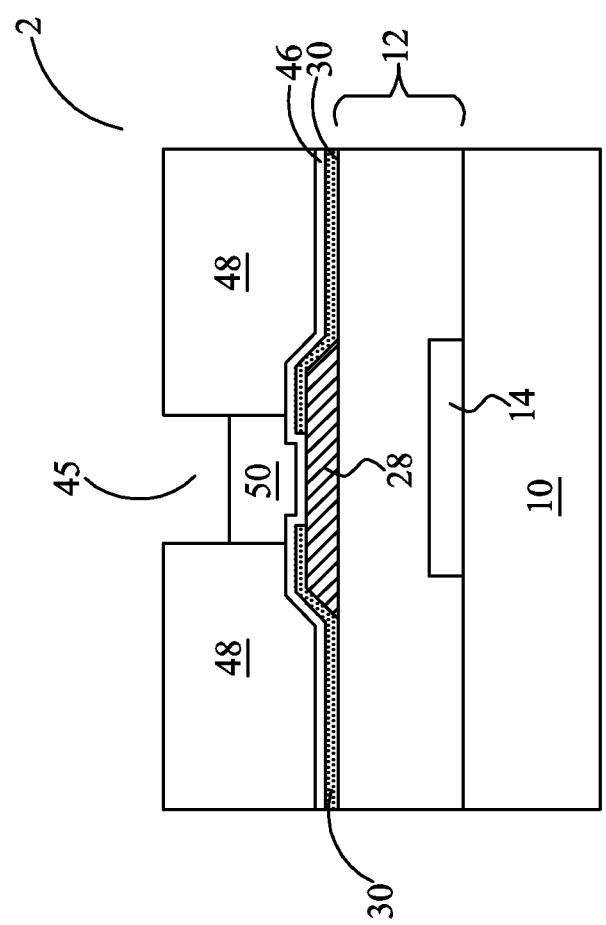

FIG. 3 illustrates the formation of mask 48, which may be formed of a photo resist or a dry film, for example. Mask 48 is patterned, and a portion of UBM layer 46 is exposed through opening 45 in mask 48. Next, metal pillar 50 is formed. In an embodiment, wafer 2 is placed into a plating solution (not shown), and a plating step is performed to form metal pillar 50 on UBM layer 46 and in opening 45. The plating may be an electro-plating, an electro-less plating, an immersion plating, or the like. In exemplary embodiments, metal pillar 50 comprises pure copper, substantially pure copper, or a copper alloy.

Figure 4A:
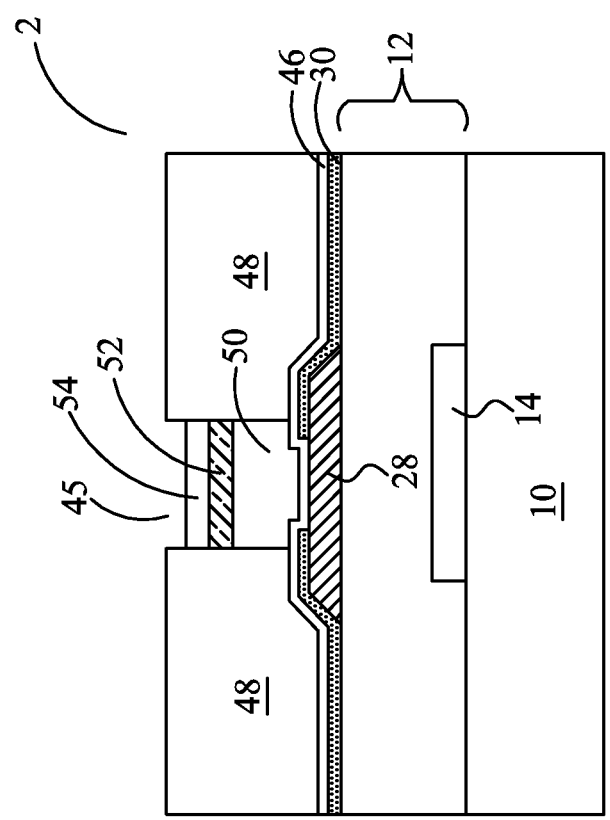

Referring to FIG. 4A, metal cap 52 is formed on metal pillar 50. Metal cap 52 acts as the barrier for inter-metallic compound (IMC) formation. In an embodiment, metal cap 52 comprises nickel. In alternative embodiment, metal cap 52 comprises other materials such as tin, palladium, or alloys thereof. Metal cap 52 may also be a composite layer comprising multiple layers such as a nickel layer, a palladium layer, or the like. Next, solder cap 54, which may comprise Sn—Ag, Sn—Cu, Sn—Ag—Cu, or the like, is formed on metal cap 52. Both metal cap 52 and solder cap 54 may be plated, for example, using electro plating, with mask 48 acting as the plating mask. Accordingly, the edges of metal cap 52 and solder cap 54 are aligned to the respective edges of metal pillar 50.

Figure 4B:
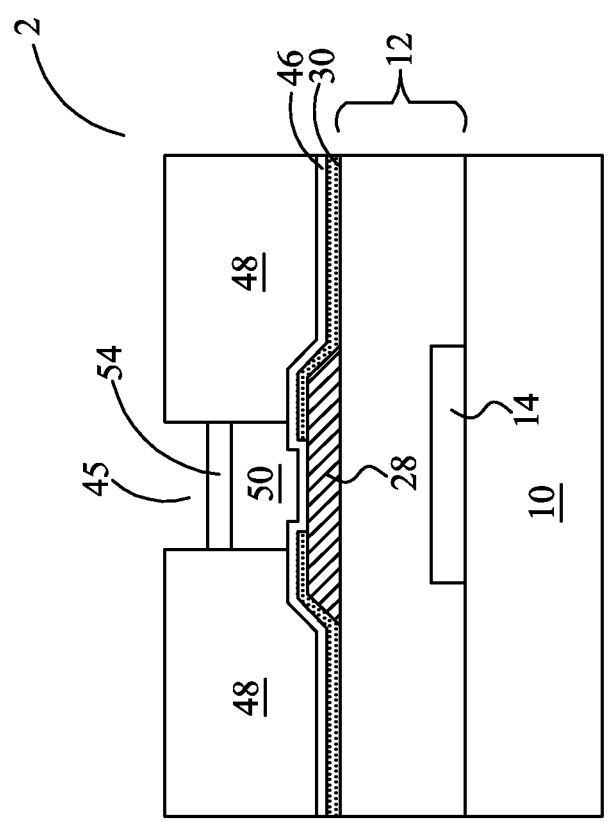

FIG. 4B illustrates an alternative embodiment, wherein no metal cap 52 is formed, and solder cap 54 is formed directly on, and in physical contact with, the copper-containing metal pillar 50. Similarly, solder cap 54 may be plated, for example, using electro plating, with mask 48 acting as the plating mask. Accordingly, the edges of solder cap 54 are aligned to the respective edges of metal pillar 50.

Figure 5A:
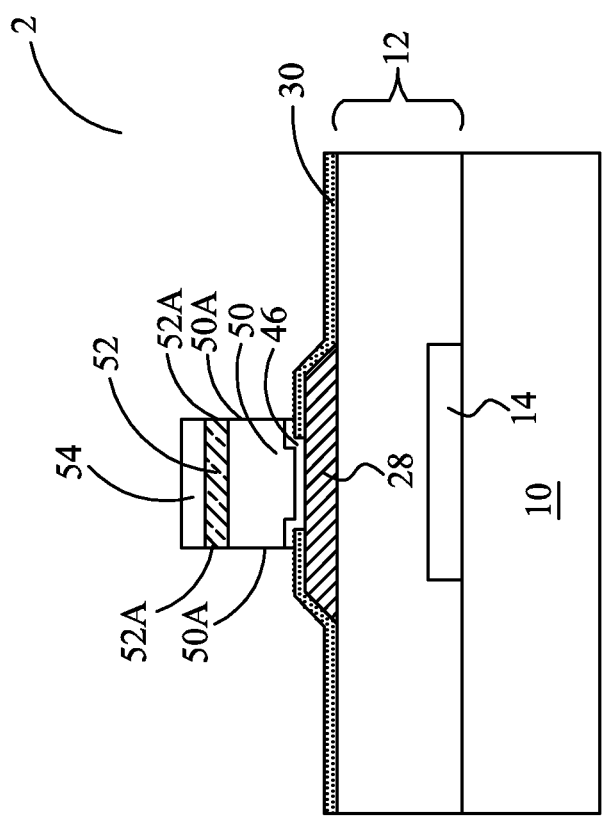
Figure 5B:
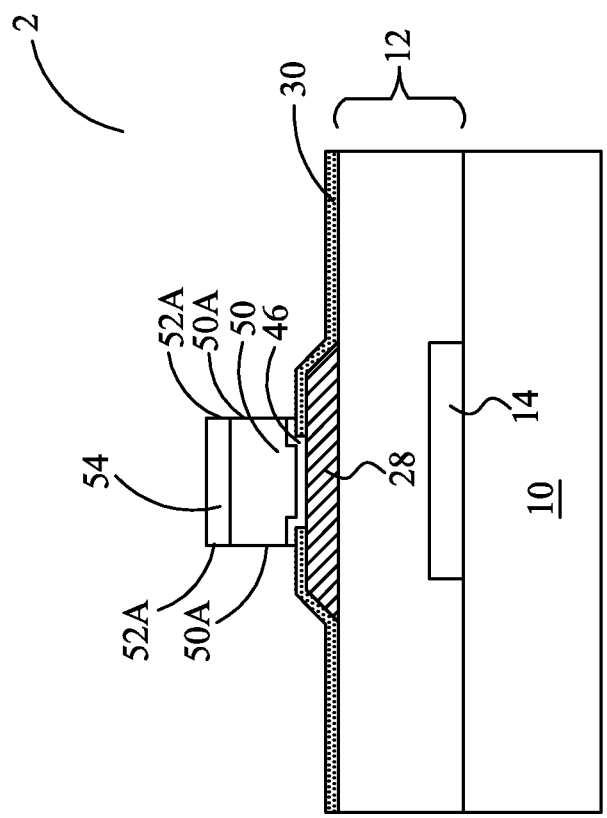

FIGS. 5A and 5B illustrate the removal of mask 48 and the portions of UBM layer 46 that are covered by mask 48. The removal may be performed, for example, using etching. In the resulting structure shown in FIGS. 5A and 5B, which correspond to the structures in FIGS. 4A and 4B, respectively, sidewalls 52A of metal cap 52 and sidewalls 50A of metal pillar 50 are exposed. Sidewalls 52A and sidewalls 50A are wettable to (the molten) solder.

Figure 5C:
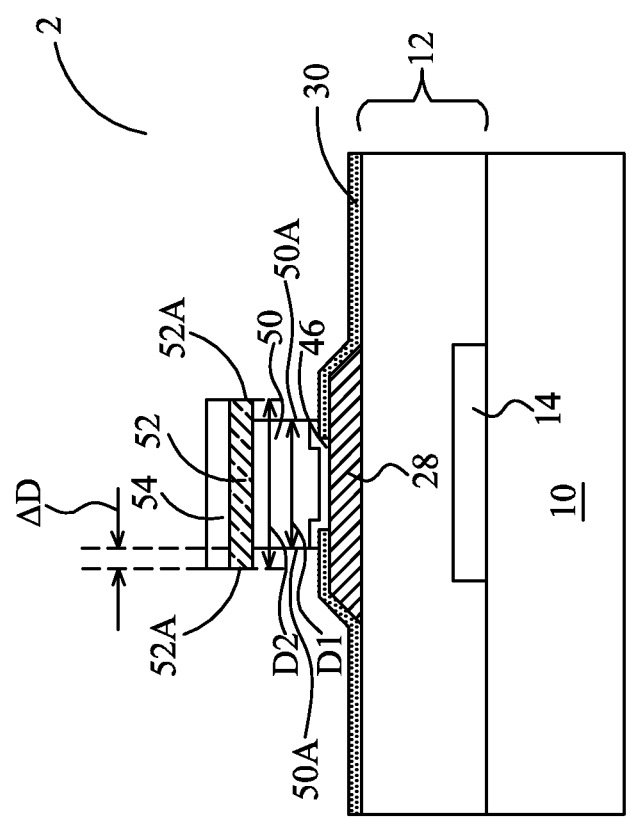

Optionally, as shown in FIG. 5C, after the removal of UBM layer 46, the lateral size D1 of metal pillar 50 may be reduced to smaller than lateral size D2 of metal cap 52. This may be achieved by further etching metal pillar 50 after the removal of mask 48. The etching may be performed using an etchant that attacks metal pillar 50, and does not attack metal cap 52 and solder region 54. In an embodiment, edges 52A of metal cap 52 extend beyond the respectively edges 50A of metal pillar 50 by distance ΔD, which may be greater than about 1 μm, or greater than about 2 μm, for example. In alternative embodiments, the formation of metal cap 52 that is larger than metal pillar 50 may be achieved by forming a first photo resist (not shown) to form metal pillar 50. The first photo resist has essentially the same pattern as mask 48. The top surface of metal pillar 50 may be substantially level to the top surface of the first photo resist. Next, without removing the first photo resist, a second photo resist (not shown) may be formed and defined to form an opening having lateral size equal to D2, with metal pillar 50 exposed through the opening. Metal cap 52 may then be plated in the opening in the second photo resist.

Figure 6A:
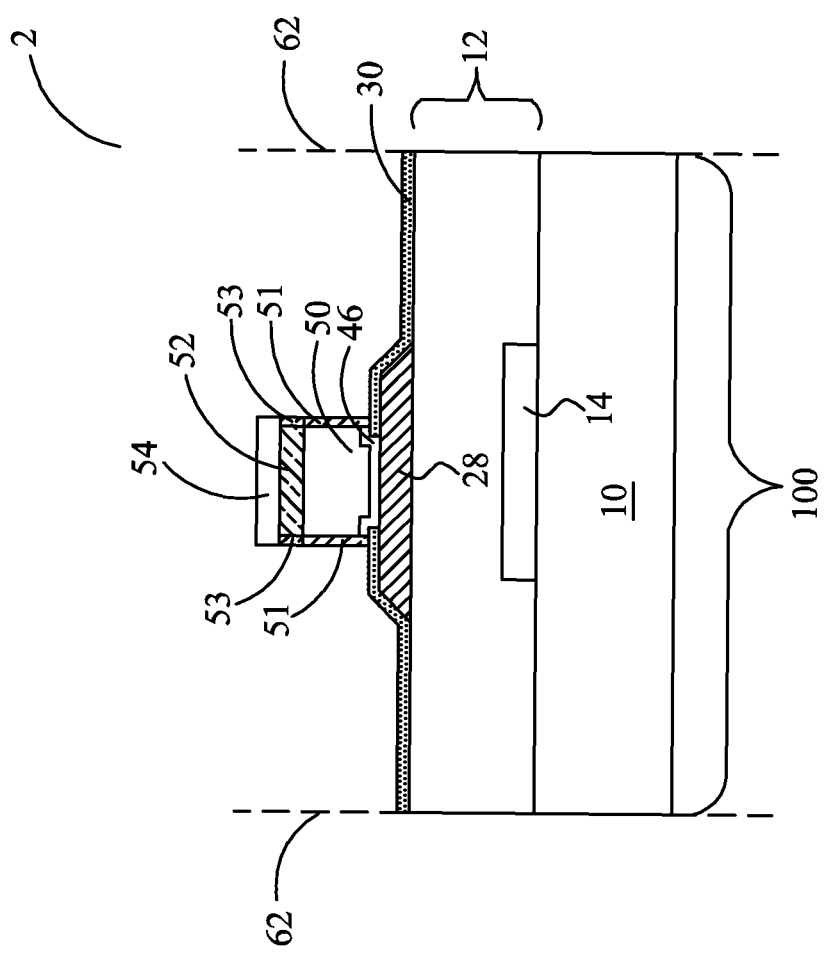
Figure 6B:
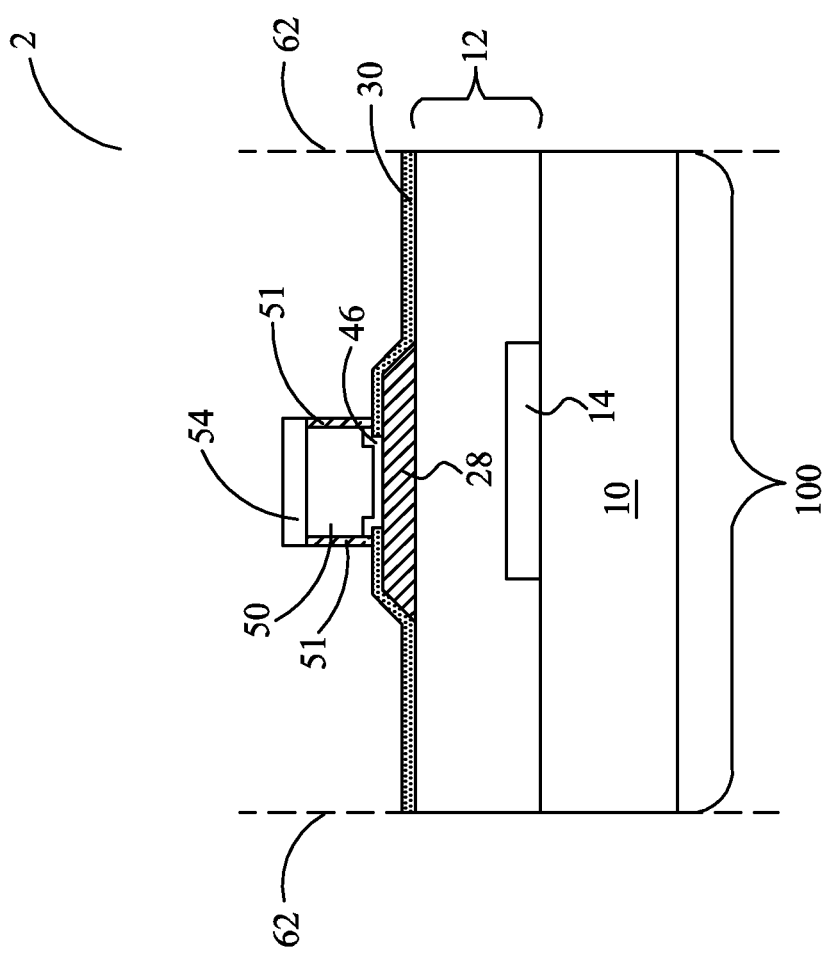
Figure 6C:
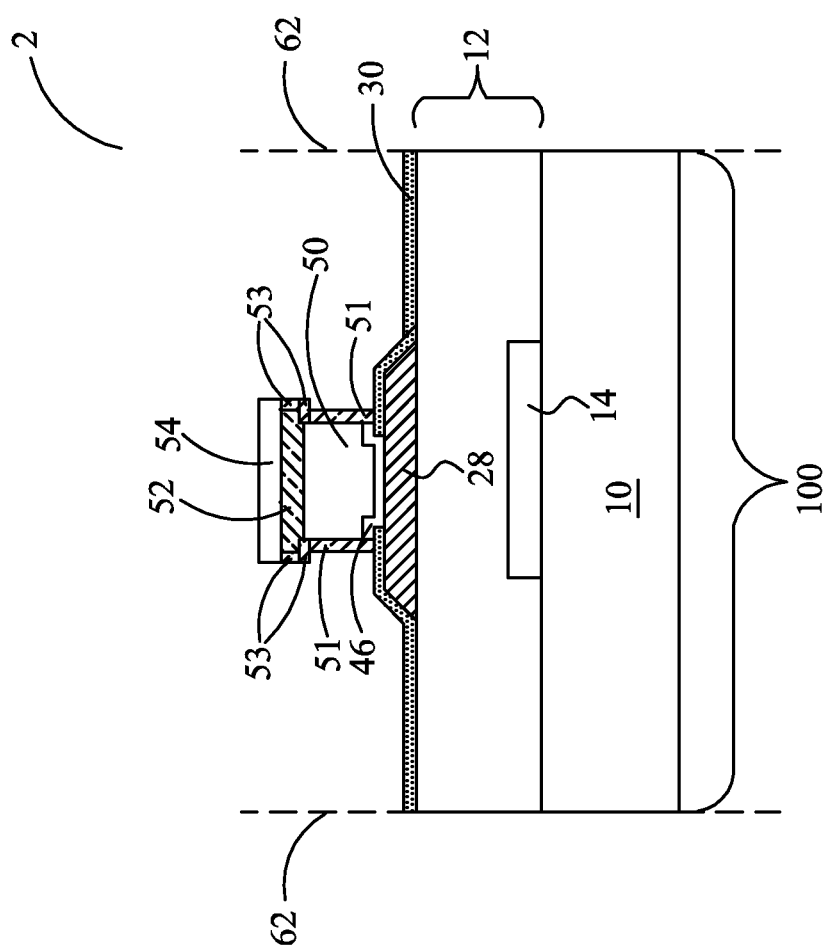

Next, as shown in FIGS. 6A through 6C, a treatment is performed on wafer 2 using a treatment gas comprising nitrogen ($N_2$), oxygen ($O_2$), or a combined gas including both nitrogen ($N_2$) and oxygen ($O_2$). The treatment may be performed in a thermal environment comprising the treatment gas, wherein wafer 2 may be heated to a temperature between about 100° C. and about 200° C., for a duration between about 10 minutes and about 120 minutes. Alternatively, the treatment may be performed using the plasma that is generated from the treatment gas, wherein the duration of the treatment may be between about 0.1 minutes and about 15 minutes. As a result of the treatment, as shown in FIG. 6A, non-wettable layers 51 and 53 are generated on the sidewall surfaces of metal pillar 50 and metal cap 52, respectively. Since non-wettable layers 51 and 53 are converted from metal pillar 50 and metal cap 52, respectively, non-wettable layers 51 and 53 comprise the materials of the respective metal pillar 50 and metal cap 52 and an additional element(s) such as nitrogen, oxygen, and combinations thereof. For example, depending on the materials of metal pillar 50 and metal cap 52 and the treatment gas, non-wettable layer 53 may comprise a nitride, an oxide, or an oxynitride (of the metal in metal cap 52) such as NiN, NiO, or NiON. Non-wettable layer 51 may comprise a nitride, an oxide, or an oxynitride (of the metal in metal pillar 50) such as CuN, CuO, or CuON. Non-wettable layers 51 and 53 are not wettable to (the molten) solder, and it is difficult for the molten solder to be attached thereon.

In FIG. 6B, no metal cap 52 is formed, and non-wettable layer 51 is formed on the sidewall surfaces of metal pillar 50. FIG. 6C illustrates the formation of non-wettable layers 51 and 53, with metal pillar 50 being laterally smaller than metal cap 52. In these embodiments, non-wettable layer 53 may include a portion formed on a bottom surface of metal cap 52, which bottom surface belongs to the portion of metal cap 52 that extends beyond metal pillar 50. The materials of non-wettable layers 51 and 53 in FIGS. 6B and 6C may be essentially the same as that in FIG. 6A, depending on the materials of metal pillar 50 and metal cap 52 and the treatment gas. After the treatment for forming non-wettable layers 51 and 53, wafer 2 as shown in FIGS. 6A, 6B, and 6C may be sawed into dies 100 along scribe lines 62.

FIGS. 7A through 7E illustrate the bonding of package component 100 to package component 200. In accordance with some embodiments, package component 200 is a device die, which may be a graphic die, a memory die, a core device die, or the like. Package component 200 may include active devices 214 such as transistors therein. Alternatively, package component 200 may comprise passive devices (also represented by feature 214), and may be free from active devices. Alternatively, package component 200 may be an interposer, a package substrate, a printed circuit board (PCB), or the like. Package component 200 may include metal pillar 150, and optionally metal cap 152, wherein metal pillar 150 and metal cap 152 may be formed of essentially the same materials, and have essentially the same properties and dimensions, as the respective metal pillar 50 and metal cap 52 as in package component 100. To bond package components 100 and 200, a reflow is performed to melt and join solder cap 54 (FIGS. 6A through 6C) and the solder cap (if any) in package component 200. After the reflow, solder region 60 is formed to join package components 100 and 200.

Figure 7A:
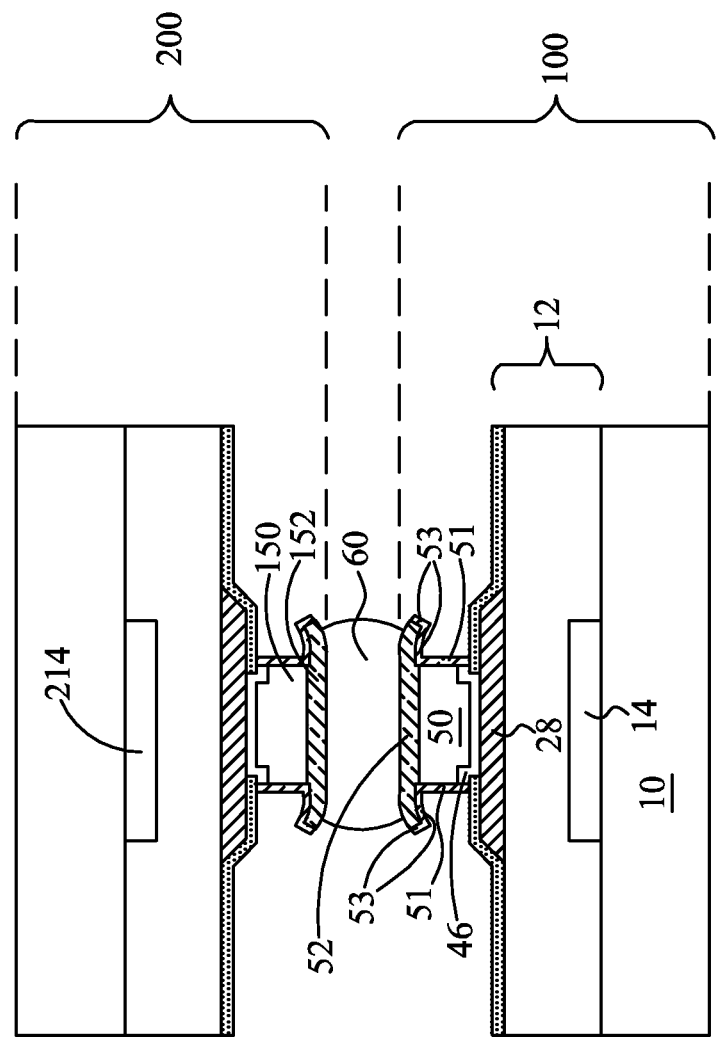
FIGS. 7A through 7E illustrate cross-sectional views of the package component bonded to another package component in accordance with various embodiments.
Figure 7B:
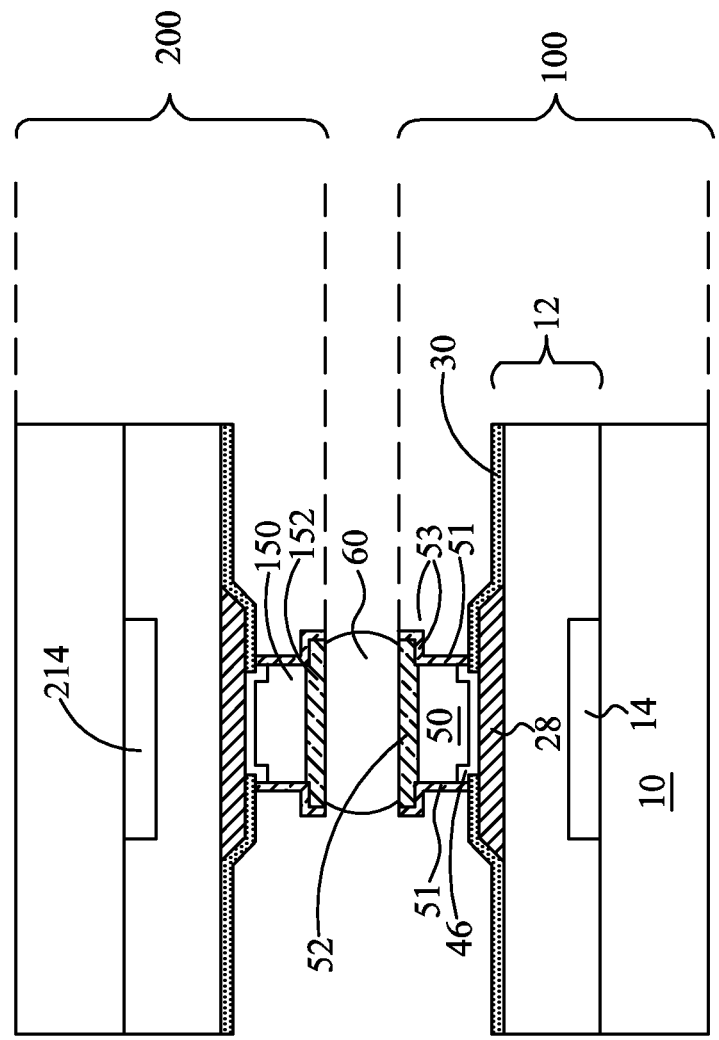
Figure 7C:
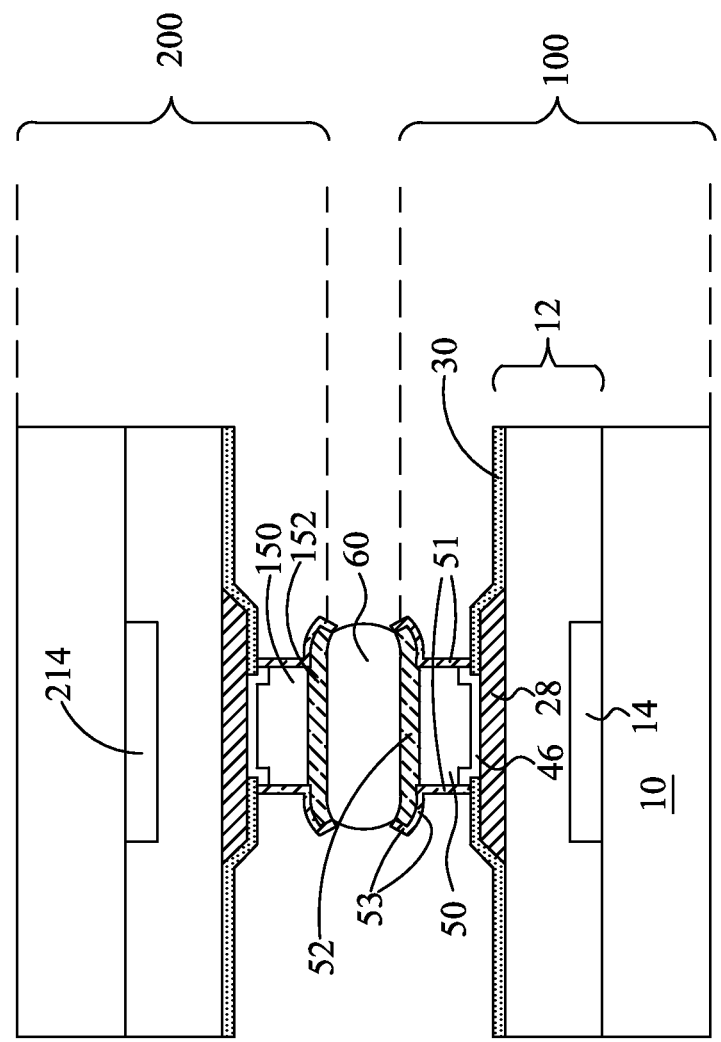
Figure 7D:
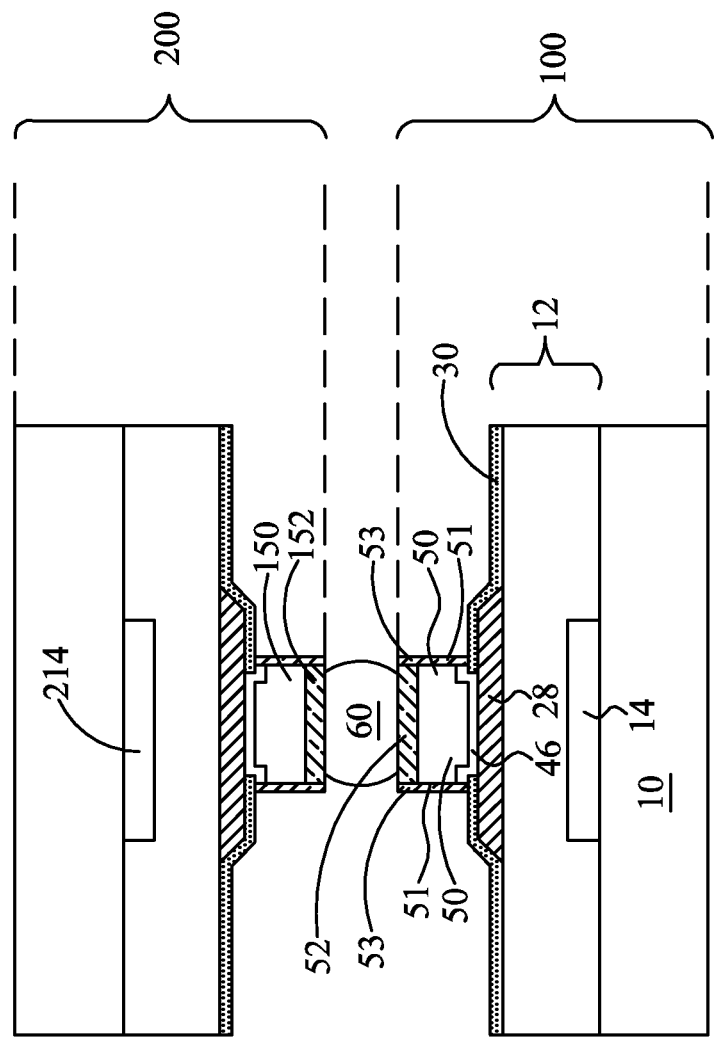
Figure 7E:
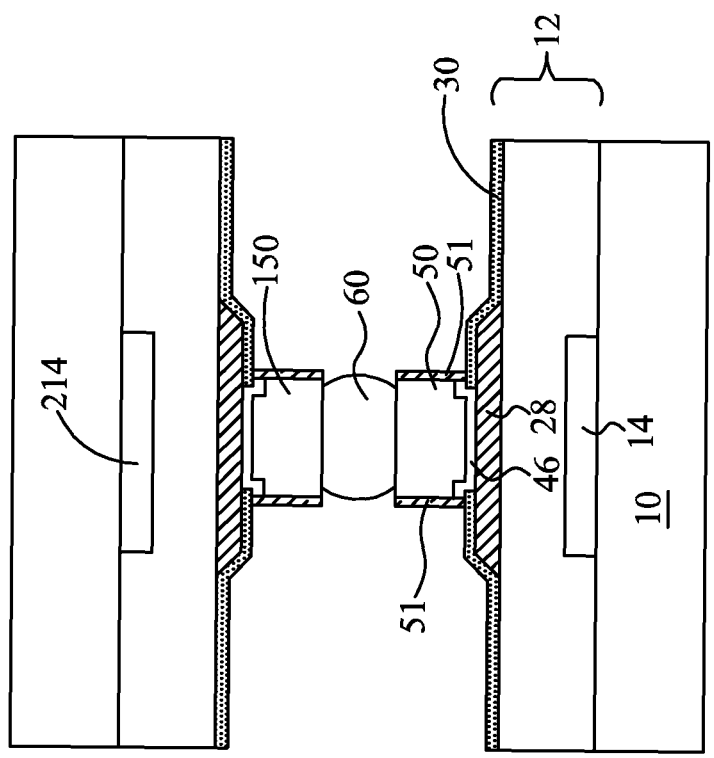

Referring to FIG. 7A, due to the stress applied to metal cap 52, the edge portions of metal cap 52 bends toward substrate 10 of package component 100, which edge portions extend beyond metal pillar 50. FIG. 7B illustrates that metal cap 52 is substantially flat. In FIG. 7C, due to the stress applied to metal cap 52, the edge portions of metal cap 52 bend away from substrate 10 of package component 100. The stress may be caused partially by the reflow process. FIG. 7D illustrates the embodiment wherein metal cap 52 has substantially the same lateral size as the underlying metal pillar 50. FIG. 7E illustrates the embodiment wherein no metal cap 52 is formed, and solder region 60 is in contact with metal pillar 50.

In the embodiments in FIGS. 7A through 7E, since layers 51 and 53 are not wettable, the surface tension of the molten solder keeps solder region 60 limited to the top surface of metal cap 52 if it is formed, or to the top surface of metal pillar 50 if no metal cap 52 is formed. Accordingly, solder region 60 does not flow to the sidewalls of metal pillar 50 and metal cap 52. The profile of solder region 60 is thus well controlled, and the risk of incurring bridging between neighboring solder regions is reduced. In addition, having a metal cap larger than the underlying metal pillar may effectively hold the solder region in place, and the likelihood of incurring overflow of solder may be reduced.

In accordance with embodiments, a device includes a top dielectric layer having a top surface. A metal pillar has a portion over the top surface of the top dielectric layer. A non-wetting layer is formed on a sidewall of the metal pillar, wherein the non-wetting layer is not wettable to the molten solder. A solder region is disposed over and electrically coupled to the metal pillar.

In accordance with other embodiments, a device includes a polymer layer having a top surface, and a copper-containing metal pillar having a portion over the top surface of the polymer layer. A first non-wetting layer is disposed on a sidewall of the copper-containing metal pillar, wherein the first non-wetting layer comprises a material selected from the group consisting essentially of a copper nitride, a copper oxide, and a copper oxynitride. A nickel-containing metal cap is formed over the copper-containing metal pillar. A second non-wetting layer is disposed on a sidewall of the nickel-containing metal cap, wherein the second non-wetting layer comprises a material selected from the group consisting essentially of a nickel nitride, a nickel oxide, and a nickel oxynitride. A solder region is disposed over the nickel-containing metal cap.

In accordance with yet other embodiments, a method includes forming a top dielectric layer of a package component, forming a metal pillar extending over a top surface of the top dielectric layer, and forming a solder region over, and electrically coupled to, the metal pillar. A treatment is then performed to a sidewall surface of the metal pillar to form a non-wettable surface layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a top dielectric layer having a top surface;
   a metal pillar comprising a portion over the top surface of the top dielectric layer;
   a metal cap over the metal pillar, wherein a portion of the metal cap is aligned to the metal pillar, and wherein the metal cap has a lateral size greater than a lateral size of the metal pillar;
   a first non-wetting layer on a sidewall of the metal cap, wherein the first non-wetting layer is not wettable to molten solder; and
   a solder region over and electrically coupled to the metal cap.

2. The device of claim 1 further comprising a second non-wetting layer on a sidewall of the metal pillar, wherein the second non-wetting layer is not wettable to molten solder, and wherein the second non-wettable layer comprises materials for forming the metal pillar and an element selected from the group consisting essentially of nitrogen, oxygen, and combinations thereof.

3. The device of claim 2, wherein the metal cap and the metal pillar comprise different materials, and wherein the second non-wetting layer does not extend between the metal cap and the metal pillar.

4. The device of claim 1, wherein the first non-wetting layer does not extend between the metal cap and the solder region.

5. The device of claim 1 wherein the first non-wettable layer comprises materials of the metal cap and an element selected from the group consisting essentially of nitrogen, oxygen, and combinations thereof.

6. The device of claim 1, wherein the top dielectric layer and the metal pillar are comprised in a device die, wherein the device further comprises a package component bonded to the device die through the solder region.

7. A device comprising:
   a metal pillar comprising a portion over a top surface of a top dielectric layer;
   a metal cap over the metal pillar, wherein a portion of the metal cap is aligned to the metal pillar, and wherein the metal cap has a lateral size greater than a lateral size of the metal pillar;
   a first non-wetting layer on a sidewall of the metal cap, wherein the first non-wetting layer is not wettable to molten solder; and
   a solder region over and electrically coupled to the metal cap, wherein the first non-wetting layer does not extend between the metal cap and the solder region.

8. The device of claim 7 further comprising a second non-wetting layer on a sidewall of the metal pillar, wherein the second non-wetting layer is not wettable to molten solder, and wherein the second non-wettable layer comprises materials for forming the metal pillar and an element selected from the group consisting essentially of nitrogen, oxygen, and combinations thereof.

9. The device of claim 8, wherein the metal cap and the metal pillar comprise different materials, and wherein the second non-wetting layer does not extend between the metal cap and the metal pillar.

10. The device of claim 7, wherein the first non-wettable layer comprises materials of the metal cap and an element selected from the group consisting essentially of nitrogen, oxygen, and combinations thereof.

11. The device of claim 7, wherein the top dielectric layer and the metal pillar are comprised in a device die, wherein the device further comprises a package component bonded to the device die through the solder region.

* * * * *